United States Patent

Doyle et al.

[11] Patent Number: 5,811,980
[45] Date of Patent: Sep. 22, 1998

[54] TEST SYSTEM FOR DETERMINING THE ORIENTATION OF COMPONENTS ON A CIRCUIT BOARD

[75] Inventors: John Doyle, Franklin; Jeffrey Collette, Acton, both of Mass.

[73] Assignee: GenRad, Inc., Concord, Mass.

[21] Appl. No.: 517,573

[22] Filed: Aug. 21, 1995

[51] Int. Cl.$^6$ .................................................. G01R 31/02
[52] U.S. Cl. .......................... 324/758; 324/688; 324/662
[58] Field of Search ................................... 324/688, 662, 324/758, 756, 764

[56] References Cited

U.S. PATENT DOCUMENTS

| | | | |
|---|---|---|---|
| 4,350,040 | 9/1982 | Fasching | 324/688 |
| 4,583,042 | 4/1986 | Riemer . | |
| 4,779,043 | 10/1988 | Williamson, Jr. . | |
| 5,081,421 | 1/1992 | Miller | 324/688 |
| 5,124,660 | 6/1992 | Cilingiroglu . | |
| 5,130,661 | 7/1992 | Beck | 324/688 |
| 5,150,047 | 9/1992 | Saito et al. . | |
| 5,159,526 | 10/1992 | Marek . | |
| 5,254,953 | 10/1993 | Crook et al. . | |
| 5,363,051 | 11/1994 | Jenstrom | 324/688 |
| 5,391,993 | 2/1995 | Khazam et al. . | |
| 5,469,064 | 11/1995 | Kerschner | 324/758 |
| 5,539,676 | 7/1996 | Yamaguchi | 324/758 |

FOREIGN PATENT DOCUMENTS 0 599 544 A1  6/1994  European Pat. Off. .

*Primary Examiner*—Ernest F. Karlsen
*Assistant Examiner*—Jose M. Solis
*Attorney, Agent, or Firm*—Cesari and McKenna, LLP

[57] ABSTRACT

The invention is a tester that uses a capacitive probe to test whether components that have multiple power and/or ground pins are correctly oriented relative to the signal-pin tracks on a circuit board. The tester connects, to the signal-pin track to which the pin under test is connected, a test-signal source that supplies to that pin a relatively high-voltage test signal. The tester actively guards the pin by applying to the remaining component pins, through the tester scanning system and its internal resistance, a signal that has the same voltage as that sensed by the capacitive probe. If the component is oriented such that one of the multiple power or ground pins is connected to the signal-pin track to which the test signal is applied, the test signal appears also at the other power or ground pins, since these pins are interconnected by a low impedance path through the component. The signals on these interconnected pins are capacitively coupled through the component lead frame to the capacitive probe, which senses a much higher voltage than it does when the test signal appears at a single signal pin. Accordingly, the tester determines if a power or ground pin is connected to the signal-pin track by comparing the voltage at the capacitive probe with a predetermined threshold. The tester may also determine how much the component is misoriented by testing each of the pins and comparing the measured voltages with rotation patterns, which are determined by mapping the thresholds associated with the pins of a properly oriented component to the pin locations to which the pins may be rotated if the component were incorrectly oriented.

8 Claims, 4 Drawing Sheets

TEST SYSTEM FOR DETERMINING THE ORIENTATION OF COMPONENTS ON A CIRCUIT BOARD

FIELD OF INVENTION

The invention relates generally to systems for testing electronic-circuit boards.

BACKGROUND OF THE INVENTION

Testing for proper functioning of electronic-circuit boards has been performed automatically for decades. The functionality of the entire board may be tested using digital test vectors and/or the individual components may be tested. There are essentially two types of tests that can be used to test the individual components, those performed using component-specific digital test vectors and those performed by probing the component pins to detect open circuits.

If the component-specific test vectors are known, they will generally be used to test if the component is in the correct location on the board and is properly functioning. This type of test involves sending a series of test signals or digital vectors to the component and determining if the component responds appropriately. For such tests, the board is typically placed in a "bed of nails" fixture, in which a large number of spring probes, or "nails," simultaneously contact respective nodes, or signal tracks, on the underside of the board. Various automatic switching mechanisms in an automatic circuit tester then connect the nails to various driving and sensing circuitry, causing stimulus to be applied to the board and/or the component of interest, and the response to be recorded.

If the test vectors are used, they reveal if a component is "good" or "bad." A good component is one that produces the expected response, and a bad component is one that produces any response other than the expected one. A bad component may be one that is only partially functional, or one that, while fully functional, is incorrectly oriented relative to the signal tracks. For example, the component may be rotated such that pin 1 is connected to the signal track to which pin 6 is supposed to be connect, pin 2 is connected to the signal track to which pin 7 is supposed to connect, and so forth. The test does not reveal that the component is incorrectly oriented, only that it does not produce the expected responses.

As the components become more complex, it may be impractical to test them using the test vectors. The time allocated to testing each component is short and a relatively large number of vectors are required to fully test such a component. Also, test developers may not have made available to them by the component manufacturer the information they need to develop the test vectors for these components. In particular, the test developers may not have the information for components such as ASICs that are custom-designed, mass-produced components. In such circumstances, these components can not be functionally tested, and they are instead tested to determine if their pins are electrically connected to the signal tracks on board.

To test for electrical connection, the tester uses probes to determine if a pin is connected to a particular track of if the pin is instead an open circuit. The most-straightforward way of testing for the open circuits is to place the probes directly on the component pins, to determine whether signals applied to the board tracks to which the pins are supposed to be connected appear on the pins. Probing considerations on the component side of the board differ from those that prevail on the underside, or non-component side, of the board, however. The probe target, that is, the component pin, is much more fragile and sometimes more difficult to hit than a signal track. Moreover, it is virtually impossible to make actual contact with a pin of a surface-mount-technology component. So, component-side probes proposed for high-volume open-circuit tests have usually been of the non-contact type and typically capacitive.

A tester that employs a capacitive probe applies a stimulus signal (typically from the non-component side) to a track to which the component pin in question should be connected. Since the pin is mounted in a component package that houses an integrated circuit, the internal connection between the pin and the integrated circuit is typically made through a lead frame. The lead frame provides a conductive surface that can capacitively couple the pin signal to a capacitive probe in the form of a conductive plate placed adjacent to the component package's upper surface.

To determine whether the connection is properly made, the tester essentially measures the series capacitance in the path from the board track through the pin and the lead frame to the capacitive probe. If there is a connection between the track and the pin, that capacitance consists essentially of the capacitance between the capacitive probe and a lead-frame "leg" that connects the pin being tested to the integrated circuit. An improper connection interposes a further, much smaller capacitance between the component pin and the track to which it should be connected. This results in a very low series capacitance and thus a very high impedance, which greatly attenuates the signal coupled from the path to the probe. This absence of a significant signal can therefore be taken as an indication of an open pin.

While the foregoing description of a capacitive test describes the manner in which it should ideally work, complications arise in practice. Board topology can result in capacitances that parallel the connection-dependent capacitance of interest and thus result in significant measured capacitance even when the pin is open. To increase reliability, a tester will typically be subjected to "training." In training, capacitance measurements are made for the various pins of a known good board of the type to be tested. These values are then stored and employed in imposing the criteria by which connection integrity is judged. Specifically, if the capacitance measured for a given pin on a known good board has a given value, then the corresponding pin on a board under test is judged not to be connected properly if the measured capacitance is less than a predetermined percentage of the given value.

The component of interest in an in-circuit test is typically connected to a number of other components. These connections tend to make the test measurements inaccurate if compensating measures are not taken. One such measure is to passively or actively "guard" the component of interest.

Passive guarding essentially means grounding nearby components to reduce the degree to which they adversely affect the test. There may also be capacitive or direct coupling between tracks, and thus, the tracks that are connected to the device pins that are not then under test are also grounded.

Active guarding essentially means providing to the nodes signals that ensure that the components or pins, which would otherwise couple directly or capacitively to the component or pin under test, are held to the voltage that is sensed by the probe. The signals on these components or pins then do not significantly affect the test measurements.

To test a component, the tester guards the component and applies an AC source to the track to which a particular pin of interest is supposed to be connected. It then determines, based on the signal at an associated probe, if the pin of interest is properly connected. It thus determines if the signal at the probe exceeds the predetermined percentage of the previously measured voltage associated with a known good board. This test does not determine whether or not the pin is the correct pin, that is, whether or not the component is properly oriented relative to the signal tracks. Thus, a component that "passes" this test may cause the board to function improperly.

To determine if the rotation of a component is what is causing a "bad" vector-test result or a board malfunction, known prior systems rely on visual inspection. If the visual inspection reveals that the component is rotated, the assembler can detach the component, re-orient it and re-attach it. This saves needless replacement of otherwise good components that may each cost tens or hundreds of dollars. Visual inspection to determine component orientation, however, is unreliable, particularly as component density increases and component size decreases.

SUMMARY OF THE INVENTION

The invention is a tester that uses a capacitive probe to test whether components that have multiple power and/or ground pins are correctly oriented relative to the signal-pin tracks on a circuit board. The tester connects, to the track to which the pin under test is connected, is a test-signal source that supplies to that pin a relatively high-voltage test signal. The tester actively guards the pin by applying to the remaining component pins, through the tester scanning system, a signal that has the same voltage as that sensed by the capacitive probe. If the component is oriented such that one of the multiple power or ground pins is connected to the track to which the test signal is applied, the test signal appears also at the other power or ground pins, since these pins are interconnected by a low impedance path through the component.

The signals on these interconnected pins are capacitively coupled through the component lead frame to the capacitive probe, which senses a much higher voltage than it does when the test signal appears at a single signal pin. Accordingly, the tester determines if a power or ground pin is connected to the signal-pin track by comparing the voltage at the capacitive probe with a predetermined threshold.

More specifically, the signal source that supplies the test signals drives the pin of interest and the interconnected pins, if any, to a predetermined peak voltage. Assuming the pin under test is a signal pin, each of the remaining pins of the component are connected to the active guard circuitry. Since these pins are not interconnected to the signal pin and instead are capacitively coupled to that pin, only a very small signal associated with the test signal appears at these pins. The active guard circuitry, which is controlled by the voltage on the capacitive probe, holds the nodes to which these pins are connected at a voltage that is associated with the probe plate, and thus, essentially prevents the signals is on these pins from significantly affecting the test measurements.

If the component is misoriented, the pin under test is one of the multiple power or ground pins, and the interconnected power or ground pins are connected to the active guard circuitry. When the test signal is applied to the pin under test, for example, a power pin, the signal appears also at the other, guarded power pins. Since the test signal is much larger than the signal produced through the active guard, there is a voltage drop across the impedance of the scanning system. This means that the interconnected pins are held to the test-signal voltage, and the signals on these pins couple capacitively to the capacitive probe. The probe thus senses a larger than expected voltage when the test signal is supplied to what should be a signal pin and is instead a power or ground pin of the misoriented component.

The tester can, with training, determine the relative rotation of the component based on the voltages measured when testing each of the component pins, as discussed in more detail below.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
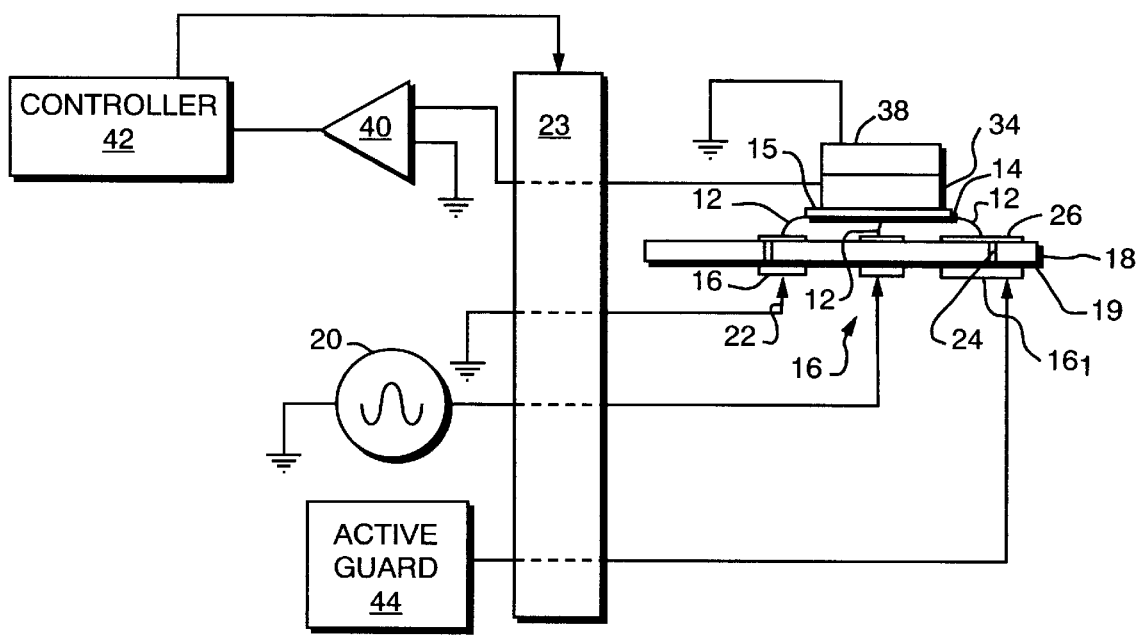
FIG. 1 is a schematic diagram of a test set up for detecting misoriented components.

FIG. 1 depicts a test setup for determining whether a component 14 is correctly oriented on a circuit board 18. The component 14 is connected through pins 12 to tracks 16 on the underside 19 on the circuit s board 18, either through pads 26 and vias 24 or through direct contact. As discussed in more detail below with reference to FIGS. 2 and 3, the component 14 includes multiple power pins and/or ground pins. If the component 14 is correctly oriented on the board relative to the tracks 16, the power pins and the ground pins connect, respectively, to tracks that will ultimately connect to system power and ground. The remaining pins of the component are signal pins that connect to respective signal-pin tracks.

The tracks 16 are also selectively connected to test instruments such as an AC source 20 through a scanning system 23 and contact probes, or "nails," 22. The nails 22 are typically ones of a large number of such nails on a "bed of nails" fixture of the type conventionally employed by high-volume testers, to apply signals to the boards-under-test.

A capacitive-probe plate 34 is positioned proximate to the component 14. As discussed in more detail with reference to FIG. 2 below, when a pin 12 is connected directly or indirectly to the AC source 20, a detectable capacitance exists between the component 14 and the probe plate 34. This capacitance appears between the tester nail 22 associated with the AC source 20 and the probe plate 34, which forms a capacitive voltage divider by virtue of the capacitance between it and a second, ground probe plate 38. The capacitance between plates 34 and 38 is known, so the resultant voltage on plate 34, as measured through amplifier 40, is an indication of the magnitude of the capacitance between the nail 22 and the plate 34.

The tracks 16 that connect to the pins 12 that are not then under test are connected through the bed of nails to active guard circuitry 44. The active guard circuitry 44 drives these tracks, or more precisely the associated signal, power and ground nodes, to essentially the same voltage as the probe plate 34. Assuming the component 14 is properly oriented, the signals on the actively guarded pins do not significantly contribute to the voltage sensed by the capacitive probe 34.

A controller 42 controls the connections of the pins 12 through the scanning system 23 to the active guard circuitry 44 and to the AC source 20. The controller also measures, through the amplifier 40, the voltage sensed by the capacitive probe 34. Further, it controls the testing operations, and in particular, the operations that determine if the component 14 is properly oriented on the board relative to the tracks 16.

Figure 2:
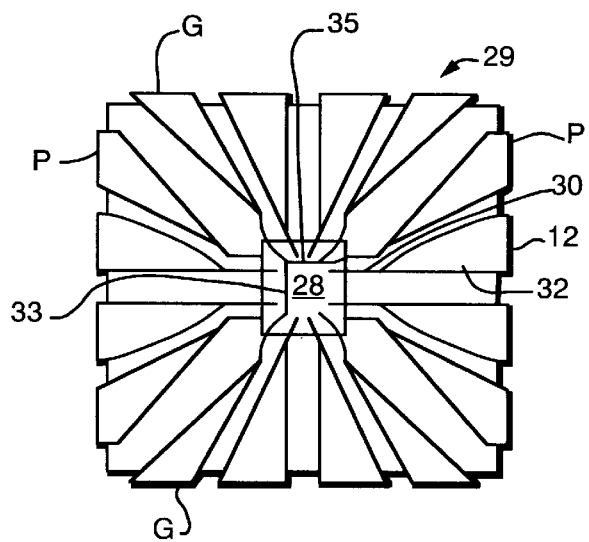
FIG. 2 is a plan view of a component with the outer packaging removed.

Referring also to FIG. 2, if a lid 15 of the component 14 were removed, the result would be a view that is similar to that depicted in the drawing. An integrated circuit die 28 connects to the pins 12 via a lead frame 29. The lead frame includes bond wires 30, which connect components formed on the die 28 to lead-frame conductors 32 that terminate in the pins 12. As FIG. 1 shows, the capacitive-probe plate 34 is disposed adjacent to the component 14 and, in particular, in parallel to the lead frame 29 that provides the lead-frame conductors 32. Thus, a detectable capacitance exists between conductor 32 and the probe plate 34. Accordingly, a signal on a pin 12 produces a signal on the associated conductor 32, which, in turn, produces a signal in the probe plate 34. The capacitance between the conductor 32 and the probe plate 34 is relatively small, and thus, the signal on the probe plate is a highly attenuated version of the test signal voltage.

If the component 14 includes multiple power and/or ground pins, denoted in the drawing as "G" and "P" pins, the die 28 internally connects together all of the power pins with an internal connection 33, and all of the ground pins with an internal connection 35.

Figure 3:
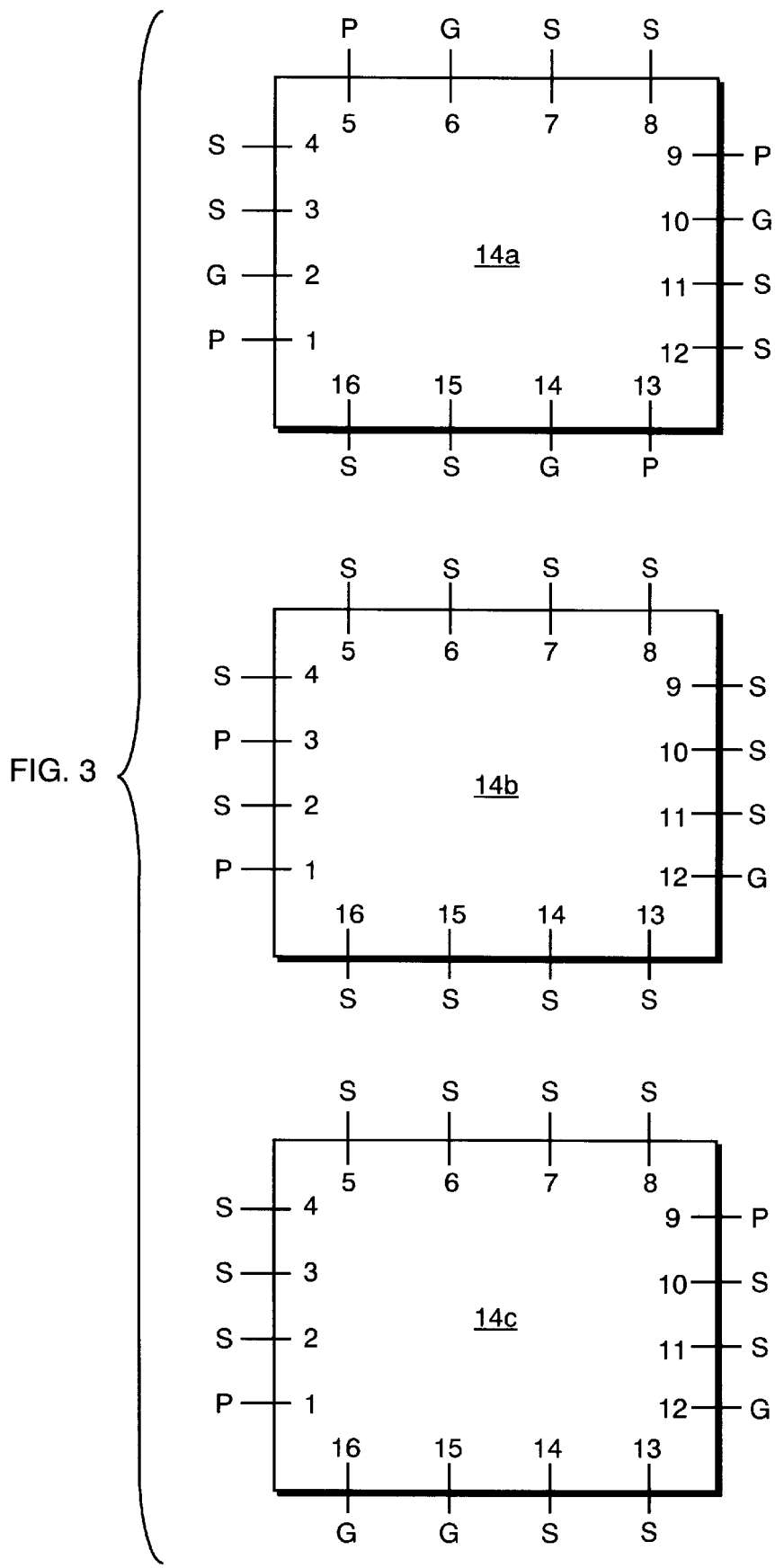
FIG. 3 is a diagram that illustrates symmetrical and asymmetrical components.

As depicted in FIG. 3, in simplified form, the components 14 may have multiple power or ground pins that are symmetrical or fully or partially asymmetrical. The component denoted 14a includes power and ground pins that are symmetrical. This means that the power and ground pins always connect to power and ground tracks, regardless of how the component is rotated relative to these tracks. Accordingly, the orientation of the component cannot always be determined reliably by the tester.

The component denoted 14b has fully asymmetrical power and ground pins. If this component is rotated relative to the power and ground tracks, the power and ground pins connect to signal-pin tracks. Accordingly, the tester can reliably determine if the component is rotated. The component denoted 14c is partially asymmetrical, and at least one of the power or ground pins connects to a signal-pin track if the component is rotated. Accordingly, the test can generally determine if the component is rotated. However, depending on the internal connections of the pins, the test may be ambiguous for certain degrees of rotation.

Figure 4:
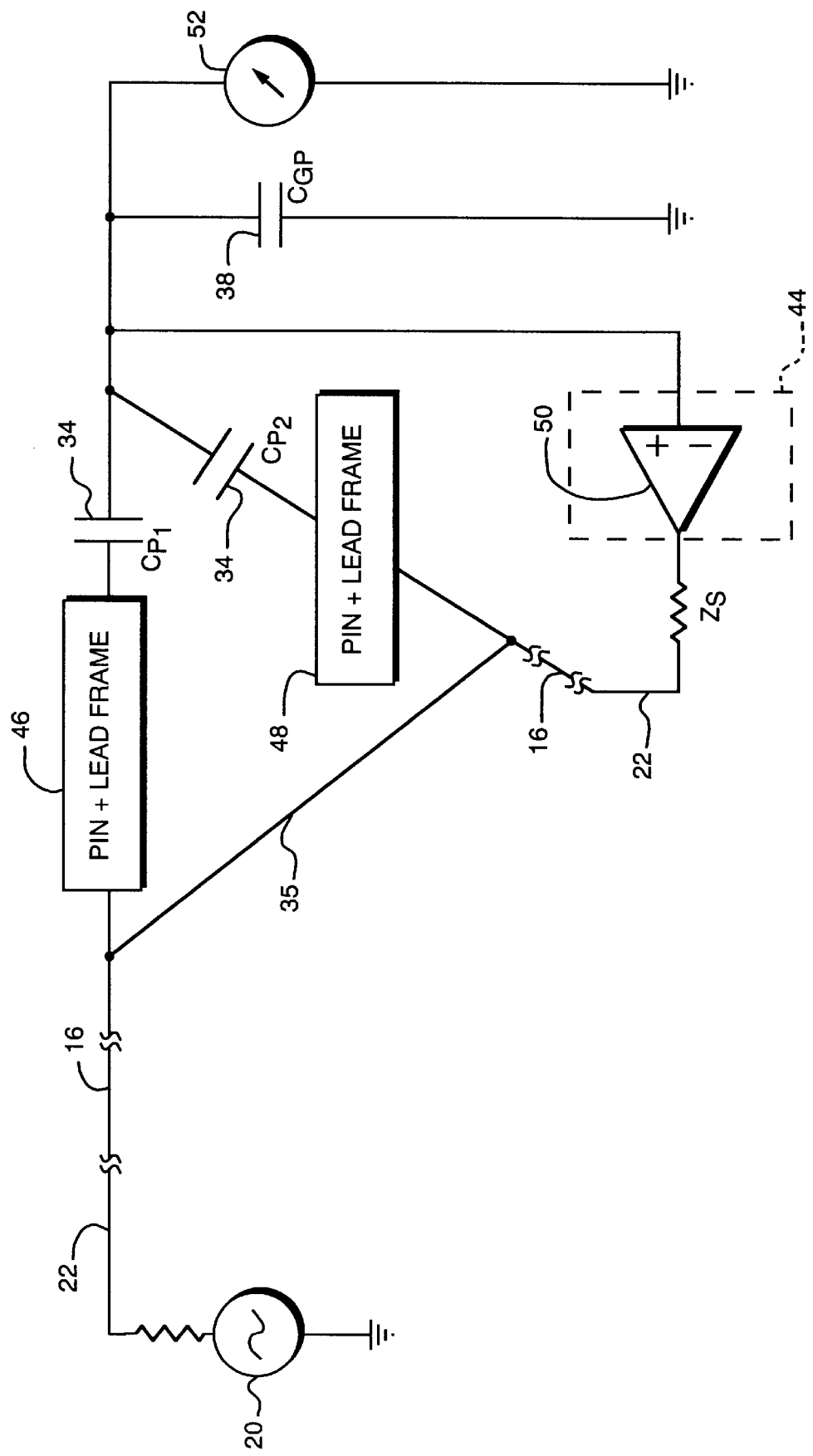
FIG. 4 is a simplified circuit diagram of the test set up.
Figure 5:
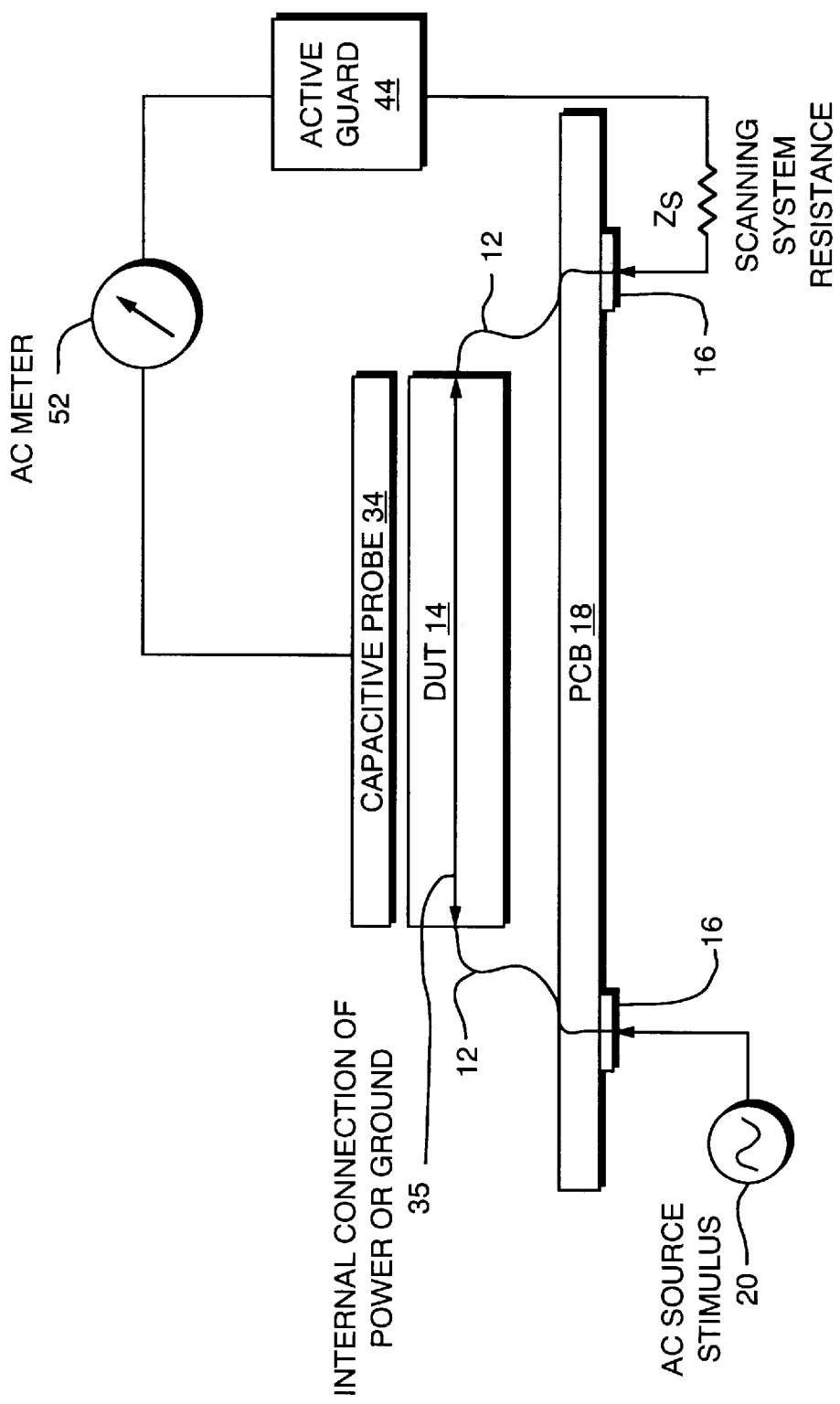
FIG. 5 is a schematic diagram of test set up for testing the orientation of a single component.

Referring now also to FIGS. 4 and 5, the operation of the tester is discussed with reference to a simplified circuit diagram of the tester. For purposes of the test, assume that the component under test is rotated such that at least one of its multiple power pins $12_{p1}$ is connected to a signal-pin track 16. The pin under test, which is a power pin, and the associated lead frame leg are denoted in the drawing by the numeral 46, and are referred to hereinafter as pin 46. The signal-pin track to which the pin-under-test is connected is also connected through one of the nails is 22 to the AC source 20. The AC source supplies to the track 16 a test signal of a predetermined peak voltage.

A second power pin $12_{p2}$ is interconnected to the power pin under test by the internal connection 35. The second power pin and the associated lead frame leg are denoted in the drawing by the numeral 48, and are referred to hereinafter as pin 48. This power pin 48 is connected to a track 16 that is connected also to the active guard circuitry 44, which is depicted in the drawing as a buffer amplifier 50. As shown in FIG. 1, the active guard circuitry connects to the track 16 through the tester's scanning circuitry 23. The resistance of this circuitry is depicted as $Z_S$ in the drawing. The buffer amplifier connects also through the scanning circuitry to every other component pin (not shown), except the pin under test.

In FIG. 4, the capacitive coupling between the pin under test 46 and the probe plate 34 is depicted as a capacitor $C_{p1}$. Similarly, the capacitive coupling between the second power pin 48 and the probe plate 34 is depicted as a capacitor $C_{p2}$. The capacitive voltage divider that includes the ground plate 38 (FIG. 1) is depicted in the drawing as $C_{GP}$. A meter 52, which is part of the controller 42 (FIG. 1), measures the voltage on the probe plate 34 through the voltage divider.

When a test signal is applied to the pin under test 46, the signal is also applied through the internal connection 35 to the second power pin 48. This drives both pins to the test-signal voltage.

The active guarding circuitry 44 that is connected to the second power pin 48 produces a signal that has the same voltage as the probe plate 34. This voltage is much lower than the applied voltage from the AC source 20. Accordingly, the current flow through the impedance $Z_S$ is controlled by the AC source, and there is a voltage drop across the impedance $Z_S$. This means that the second power pin 48 is held to the larger test-signal voltage. The signal on this power pin 48 as well as the signal on the pin under test 46 couple capacitively to the plate 34.

If the component 14 were correctly oriented and the pin under test is, as expected, a signal pin, there is no internal connection 35 between that pin and any other pin of the component. Accordingly, the test signal on the signal pin does not appear directly at the other component pins. At most, the signal pin is capacitively coupled to one or more of the component pins and thus a highly attenuated version of the test signal may appear at these other pins. If one of these pins is strongly coupled to the pin under test, the signals on the pin may exceed those produced by the active guard. Accordingly, the signals will couple capacitively to the capacitive probe. These signals, however, will be much smaller than the signals on the pins that couple directly to the AC source through a connection that is internal to the component. This means that the voltage associated with the connection of the signal source to a signal pin, even that associated with a signal pin that is strongly coupled to one or more pins on the component, is much lower than the voltage associated with the testing of one of the multiple, interconnected power or ground pins.

The tester can thus determine if a fully asymmetrical component is rotated by comparing the measured probe voltage with a predetermined threshold, which is much larger than the threshold associated with a connected signal pin. Further, the tester can always reliably determine if a partially asymmetrical component is rotated if at least one of the actively guarded power or ground pins is connected to a signal-pin track. Depending on the architecture of the component, the voltage differential between the testing of one of the multiple power or ground pins and the testing of a signal pin may be large enough to allow the tester to determine if a partially asymmetrical component is rotated to a position in which only one of the multiple power or ground pins is connected to a signal-pin track.

With training, the tester may determine the degree of rotation of the component based on the voltages associated with each of the pins of the component. To train the tester, a component that is properly oriented is tested, and the voltages associated with the testing of the signal pins and the multiple power and/or ground pins are recorded by the controller 42 (FIG. 1). The controller then determines the locations of the various pins in all possible rotations of the component and records these as rotation patterns. Thereafter, when a test is performed, the controller compares the measured voltages associated with each of the pins to the various rotation patterns to determine if the component is rotated and by how much.

The controller may, for example, take the absolute value of the difference between the measured value associated with a particular pin and the recorded values for that location in each of the rotation patterns and in the pattern associated with the correct orientation. It then measures the voltage associated with a second pin and takes the difference between the measured value and the recorded values associated with that location in the various patterns and so forth until the differences for each pin are determined. The controller then sums the differences associated with each of the patterns and selects as the orientation of the component the pattern associated with the smallest total.

Instead of taking the absolute values of the differences, the tester may instead sum the differences associated with what would be the signal pins in their proper orientation and determine an average value by dividing the total by that number of signal pins. The tester next takes the sum of the differences of what the tester determines to be the power and ground pins and determines for each of the possible rotations a power/ground-pin average value by dividing by the number of power and ground pins. If the signal-pin average value exceeds a predetermined signal-pin average threshold, the tester next determines if the signal-pin average value exceeds by a predetermined rotation threshold the lowest power/ground pin average associated with the component. If so, the tester determines that the component is misoriented. Further, it determines that the component is rotated in the orientation associated with the lowest power/ground-pin average value.

If the component is rotated relative to the tracks, and the extent of the rotation is known, the board may be sent to a repair station, either an automated station or a manually-operated station, where the component is then detached from the board, rotated to a correct orientation and re-affixed to the board.

The testing of the orientation of the component is preferably done after the component has been previously tested for open pins. Otherwise, a below-threshold test result for a particular pin may occur because one or more of the interconnected pins is an open circuit.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A test system for determining the orientation of a component that has multiple power or ground pins and signal pins, the component being mounted on a circuit board and oriented relative to signal-pin, power and ground tracks on the board, the system including:

A. a signal source for producing a test signal;
   B. a capacitive probe for sensing voltages on pins of the component;
   C. guarding means for holding to a voltage that corresponds to the voltage sensed by the capacitive probe nodes to which the component pins other than the pin under test are connected;
   D. scanning means for selectively applying the test signal to the signal-pin track to which the pin under test is connected and connecting the guarding means through an impedance to the nodes that connect to the remaining pins of the component;
   E. means for measuring the voltage at the capacitive probe; and
   F. means for determining if the component is misoriented, said means comparing the measured voltage with a predetermined test threshold that is associated with a signal pin connected to the same track and determining that the component is misoriented if the measured voltage exceeds the predetermined test threshold.

2. The test system of claim 1 wherein the means for determining if the component is misoriented includes:

a. means for determining rotation patterns associated with a plurality of incorrect orientations of the component, said means determining in each of the rotation patterns a voltage associated with the pin location under test; and
   b. said means for determining if the component is misoriented determines the orientation of the component by determining to which of the associated voltages the measured voltage is closest.

3. The test system of claim 2, wherein:

c. the scanning system serially connects the signal source to each of the pins of the component under test and connects the active guard circuitry to the other pins, as appropriate, to determine measured voltages for the all of the pins of the component, and
   b. the means for determining if the component is misoriented determines the orientation of the component by determining to which of the rotation patterns the measured voltages are closest.

4. A test system for determining the orientation of a component that has multiple power or ground pins and signal pins, the component being mounted on a circuit board and oriented relative to signal-pin, power and ground tracks on the board, the system including:

A. a signal source for producing a test signal;
   B. a capacitive probe for sensing voltages on pins of the component;
   C. guarding means for holding to a voltage that corresponds to the voltage sensed by the capacitive probe nodes to which the component pins other than the pin under test are connected;
   D. scanning means for selectively applying the test signal to the track to which the pin under test is connected and connecting the guarding means through an impedance to the signal nodes that connect to the remaining pins of the component, the scanning means applying the test signal to each of the component pins in a specified order;
   E. means for measuring the voltage at the capacitive probe; and
   F. means for determining the orientation of the component, said means comparing the measured voltages associated with the pins of the component with predetermined voltage patterns associated with different orientations of the component relative to the tracks, said means determining that the component is correctly oriented if the measured voltages are closest to the pattern that corresponds to the correct orientation.

5. The test system of claim 4, wherein the means for determining the component orientation determines that the component is misoriented if the measured voltages differ from the voltages associated with the pattern for the correct orientation by more than a predetermined amount.

6. The test system of claim 4, wherein the means for determining the component orientation determines that the component is in a particular orientation by determining to which of the predetermined patterns the measured voltages are closest.

7. A method for testing for the orientation of a component relative to signal tracks on a circuit board on which the component is mounted, the method including the steps of:

A. for a properly oriented component
   i. connecting active guarding circuitry to the tracks to which a pin not then under test is connected;
   ii. connecting a signal source to the track to which the pin under test is connected;
   iii. measuring the voltage associated with the pin under test;
   iv. recording the measured voltage; and
   v. repeating steps i–iv for each of the pins of the component;

B. determining voltage patterns associated with possible rotations of the component;

C. repeating steps i–v for a component under test;

D. comparing the measured voltages associated with the is component under test with the voltage patterns; and E. determining the orientation of the component under test by determining to which of the patterns the measured voltages are closest.

8. The method of claim 7, wherein the step of determining the orientation of the component under test includes a. taking the differences between the measured value associated with the pin in a particular location and the recorded values associated with that location in each of the patterns;

b. repeating step a for each of the pins of the component under test;

c. summing the differences associated with each pattern to produce for each pattern an associated total; and d. determining that the component under test is oriented in the same orientation as the pattern associated with the smallest total.

* * * * *